(12) United States Patent
Posen et al.

(10) Patent No.: US 11,266,005 B2
(45) Date of Patent: Mar. 1, 2022

(54) METHODS FOR TREATING SUPERCONDUCTING CAVITIES

(71) Applicant: FERMI RESEARCH ALLIANCE, LLC, Batavia, IL (US)

(72) Inventors: Sam Posen, Arlington Heights, IL (US); Anna Grassellino, Batavia, IL (US)

(73) Assignee: FERMI RESEARCH ALLIANCE, LLC, Batavia, IL (US)

( * ) Notice: Subject to any disclaimer, the term of this patent is extended or adjusted under 35 U.S.C. 154(b) by 0 days.

(21) Appl. No.: 16/784,092

(22) Filed: Feb. 6, 2020

(65) Prior Publication Data

US 2020/0260566 A1 Aug. 13, 2020

Related U.S. Application Data

(60) Provisional application No. 62/802,280, filed on Feb. 7, 2019.

(51) Int. Cl.
| | |
|---|---|
| *H05H 7/20* | (2006.01) |
| *H01P 11/00* | (2006.01) |
| *C23C 16/06* | (2006.01) |
| *C23C 16/448* | (2006.01) |
| *C23C 16/04* | (2006.01) |
| *H01P 7/06* | (2006.01) |

(Continued)

(52) U.S. Cl.
CPC ............. *H05H 7/20* (2013.01); *C23C 16/045* (2013.01); *C23C 16/06* (2013.01); *C23C 16/4485* (2013.01); *H01P 7/06* (2013.01); *H01P 11/008* (2013.01); *C01G 19/00* (2013.01); *C01G 33/00* (2013.01); *H01B 1/02* (2013.01); *H01L 39/00* (2013.01); *H01L 39/24* (2013.01); *H01L 39/2406* (2013.01); *H01L 39/2432* (2013.01); *H01L 39/2438* (2013.01)

(58) Field of Classification Search
USPC .......................................................... 427/62
See application file for complete search history.

(56) References Cited

U.S. PATENT DOCUMENTS 3,181,936 A * 5/1965 Denny .................... C23C 10/00
428/646
3,400,016 A * 9/1968 Enstrom ................. C23C 16/08
427/62

(Continued)

FOREIGN PATENT DOCUMENTS

DE 3811695 * 10/1989 ............. C23C 10/00

OTHER PUBLICATIONS

Trenikhina et al. "Performance-defining properties of Nb3Sn coating in SRF cavities", Superconductor Science and Technology, vol. 31, 13 pages. (Year: 2018).*

(Continued)

*Primary Examiner* — Brian K Talbot
(74) *Attorney, Agent, or Firm* — Loza & Loza LLP; Kevin L. Soules

(57) ABSTRACT

A system and method for treating a cavity comprises arranging a niobium structure in a coating chamber, the coating chamber being arranged inside a furnace, coating the niobium structure with tin thereby forming an Nb$_3$Sn layer on the niobium structure, and doping the Nb$_3$Sn layer with nitrogen, thereby forming a nitrogen doped Nb$_3$Sn layer on the niobium structure.

8 Claims, 7 Drawing Sheets

(51) Int. Cl.
*C01G 33/00* (2006.01)
*H01L 39/24* (2006.01)
*H01B 1/02* (2006.01)
*H01L 39/00* (2006.01)
*C01G 19/00* (2006.01)

(56) References Cited

U.S. PATENT DOCUMENTS

| | | | |
|---|---|---|---|
| 3,443,989 A * | 5/1969 | Wilhelm | H01L 39/00 427/62 |
| 3,525,649 A * | 8/1970 | Bode | H01L 39/249 148/97 |
| 3,534,459 A * | 10/1970 | Doi | H01L 39/2406 428/646 |
| 3,549,416 A * | 12/1970 | Rump | H01B 1/00 427/566 |
| 3,556,842 A * | 1/1971 | Kim | H01L 39/2409 427/62 |
| 3,578,496 A * | 5/1971 | Ziegler et al. | H01L 39/24 427/587 |
| 3,687,823 A | 8/1972 | Lugscheider et al. | |
| 3,784,452 A | 1/1974 | Martens et al. | |
| 3,902,975 A | 9/1975 | Martens | |
| 3,939,053 A | 2/1976 | Diepers et al. | |
| 4,014,765 A | 3/1977 | Roth et al. | |
| 4,072,588 A | 2/1978 | Diepers | |
| 4,127,452 A | 11/1978 | Martens et al. | |
| 4,224,087 A * | 9/1980 | Tachikawa | H01L 39/2409 148/98 |
| 4,323,402 A * | 4/1982 | Tachikawa | C23C 10/28 148/98 |
| 5,522,945 A * | 6/1996 | Murray | C23C 2/08 148/96 |
| 6,097,153 A | 8/2000 | Brawley et al. | |
| 7,151,347 B1 | 12/2006 | Myneni et al. | |
| 2011/0183854 A1 | 7/2011 | Roy et al. | |
| 2016/0309573 A1 * | 10/2016 | Kephart | H05H 7/20 |
| 2018/0027644 A1 | 1/2018 | Cooley | |

OTHER PUBLICATIONS

Pudasaini et al. "Initial growth of tin on niobium for vapor diffusion coating of Nb3Sn", Superconductor Science and Technology, vol. 22, 18 pages. (Year: 2019).*

* cited by examiner

METHODS FOR TREATING SUPERCONDUCTING CAVITIES

CROSS-REFERENCE TO RELATED APPLICATIONS

This patent application claims the priority and benefit under 35 U.S.C. § 119(e) of U.S. Provisional Patent Application Serial No. 62/802,280 filed Feb. 7, 2019, titled "METHODS AND SYSTEM FOR TREATING SUPERCONDUCTING CAVITIES." U.S. Provisional Patent Application Ser. No. 62/802,280 is herein incorporated by reference in its entirety.

STATEMENT OF GOVERNMENT RIGHTS

The invention described in this patent application was made with Government support under the Fermi Research Alliance, LLC, Contract Number DE-AC02-07CH11359 awarded by the U.S. Department of Energy. The Government has certain rights in the invention.

TECHNICAL FIELD

Embodiments are generally related to the field of accelerator cavities. Embodiments are related to superconducting radiofrequency (SRF) cavities. Embodiments are further related to superconducting materials. Embodiments are additionally related to methods and systems for creating superconducting materials. Embodiments are related to methods and systems for treating cavities to improve superconducting properties. Embodiments are also related to compositions of matter comprising nitrogen doped materials. Embodiments are further related to compositions of matter comprising nitrogen doped $Nb_3Sn$.

BACKGROUND

Particle accelerators use electromagnetic fields to generate and direct beams of charged particles. They are used in many applications, from high energy colliders to light sources used by biologists, chemists, and materials scientists. A common method for accelerating charged particles is to pass them through a large electric field produced in a superconducting radiofrequency (SRF) cavity. SRF cavities have specially shaped chambers made with a superconducting material, that allows them to behave as extremely efficient electromagnetic resonators. Superconducting radiofrequency (SRF) cavities represent the state-of-the-art technology for modern accelerators.

SRF cavities can be formed from a variety of superconducting materials. One of the most promising materials is $Nb_3Sn$. $Nb_3Sn$ has proven to have the potential for very high cryogenic efficiency even at high temperatures. However, limitations have been encountered in terms of the fields that these cavities can operate at with high efficiency. The nature of these limitations is not well understood, and only limited resources have been devoted to this problem.

The quality factor, or "Q" factor, is a dimensionless parameter that characterizes the resonance of an oscillator. A higher "Q" factor generally means the resonator resonates at a high amplitude at its resonant frequency. The quality factor of a superconducting radiofrequency (SRF) cavity is largely dependent on the material from which the cavity is formed along with fabrication parameters, and microscopic surface properties, all of which affect cavity performance. Maximizing the quality factor of such cavities presents a critical and difficult challenge, which might unlock a new generation of SRF cavities that can operate with high efficiency even at high temperature.

Various techniques are being investigated to improve the quality factor of SRF cavities. However, there are numerous obstacles to developing materials that provide a high Q factor, and low resistance, as required to move to a new paradigm for superconducting radiofrequency cavities. Never the less, SRF cavities offer unique opportunities for various applications in the quantum-regime. Accordingly, there is a need in the art for systems and methods that improve the materials used to fabricate superconducting cavities, which in turn will improve the cavities themselves.

SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the disclosed embodiments to provide a method and system for improved SRF cavity composition.

It is another aspect of the disclosed embodiments to provide new compositions of matter.

It is another aspect of the disclosed embodiments to provide methods, systems, and apparatuses for forming nitrogen doped materials.

It is another aspect of the disclosed embodiments to provide methods, systems, and apparatuses for forming a thin layer $Nb_3Sn$ on a superconducting substrate.

It is yet another aspect of the disclosed embodiments to provide methods and systems for fabricating a superconducting cavity formed with a thin layer of $Nb_3Sn$.

Accordingly, in an exemplary embodiment, a method for treating an SRF cavity comprises arranging a niobium structure in a coating chamber, coating the niobium structure with tin, forming an $Nb_3Sn$ layer on the structure, and doping the $Nb_3Sn$ layer with Nitrogen.

In an embodiment, doping the $Nb_3Sn$ layer with nitrogen further comprises pressurizing a volume holding the $Nb_3Sn$ layer with nitrogen gas, and leaving the $Nb_3Sn$ layer in the nitrogen gas for at least 1 hour. The pressure of the volume holding the $Nb_3Sn$ layer with nitrogen gas is at least 1 mTorr and at most 1 Torr. The method further comprises cooling the structure after leaving the $Nb_3Sn$ layer in the nitrogen gas for at least 1 hour. The method further comprises venting the volume holding the $Nb_3Sn$ layer after cooling the structure.

In an embodiment, the method further comprises degassing the coating chamber before coating the niobium structure with tin. The method further comprises nucleating the niobium structure after the coating chamber is degassed. The method further comprises annealing the niobium structure so that unreacted tin on the surface of the niobium structure evaporates. In certain embodiments, the niobium structure comprises a superconducting radiofrequency cavity.

In another embodiment, a system for treating a workpiece comprises a furnace, a coating chamber configured inside the furnace, a vapor material provided in the coating chamber, and a separate heater for heating the vapor material. The system further comprises a housing configured to house the furnace. The system further comprises an endplate formed in the housing and an access door formed in the endplate. The system further comprises at least one heat shield formed between the endplate and the furnace.

In an embodiment, the system further comprises a chamber support base for holding the coating chamber in the furnace. The system further comprises a chamber support sled affixed to the coating chamber, the chamber support sled being configured to engage with the chamber support base.

The system further comprises a crucible for holding the vapor material, the crucible being proximate to the separate heater. In an embodiment, the vapor material comprises tin. In an embodiment, the workpiece comprises a niobium substrate. The system further comprises a cavity holder for holding the workpiece inside the coating chamber.

In yet another embodiment, a composition of matter comprises a nitrogen doped $Nb_3Sn$ layer formed on a surface of a niobium substrate.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

Figure 1:
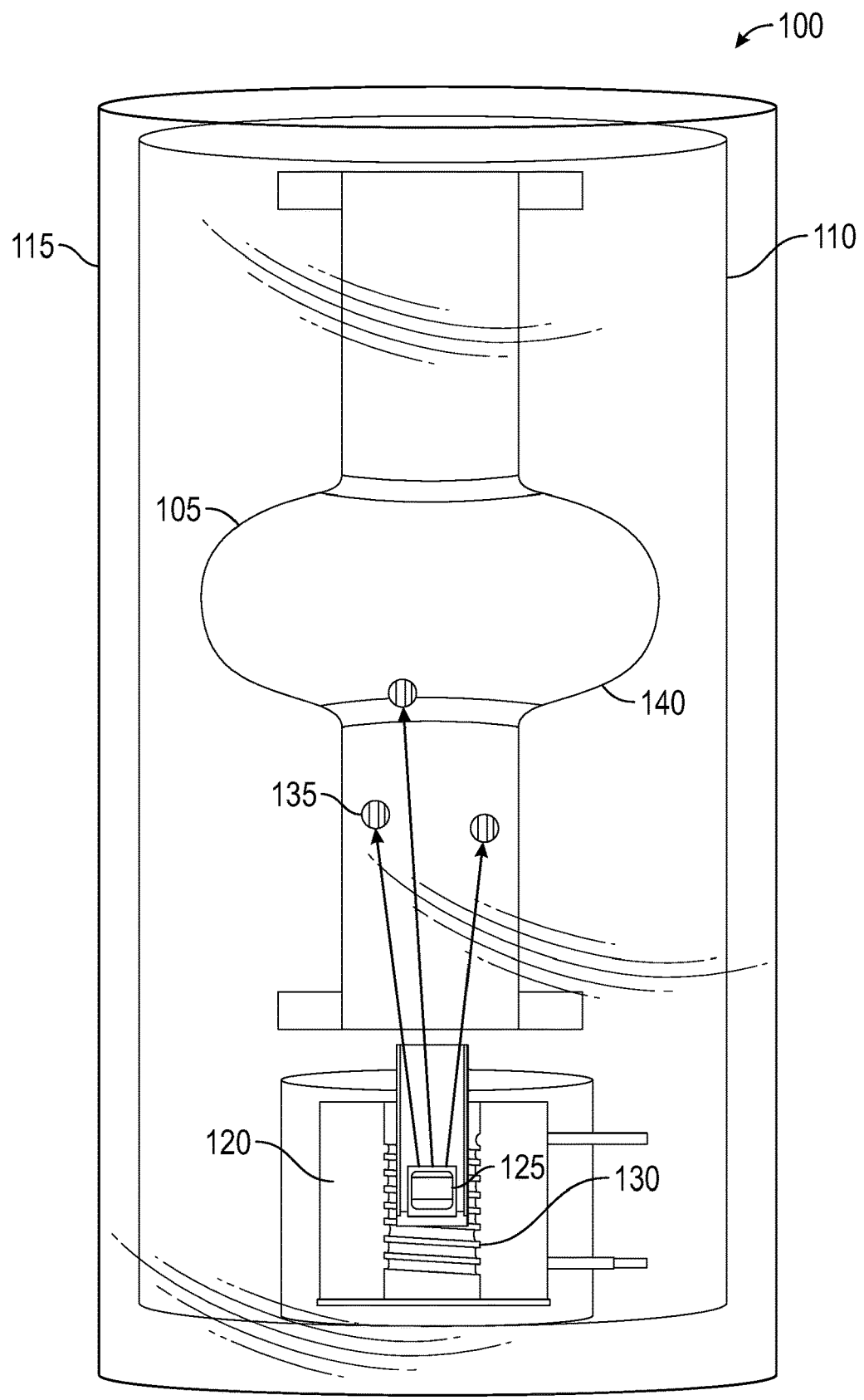
FIG. 1 depicts a system for treating a workpiece, associated with the disclosed embodiments.

The particular values and configurations discussed in the following non-limiting examples can be varied, and are cited merely to illustrate one or more embodiments and are not intended to limit the scope thereof. All values provided in the appendix are exemplary only, and may be varied in other embodiments.

Example embodiments will now be described more fully hereinafter with reference to the accompanying drawings, in which illustrative embodiments are shown. The embodiments disclosed herein can be embodied in many different forms and should not be construed as limited to the embodiments set forth herein; rather, these embodiments are provided so that this disclosure will be thorough and complete, and will fully convey the scope of the embodiments to those skilled in the art. Like numbers refer to like elements throughout.

The terminology used herein is for the purpose of describing particular embodiments only and is not intended to be limiting. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It is contemplated that any embodiment discussed in this specification can be implemented with respect to any method, kit, reagent, or composition, and vice versa. Furthermore, compositions can be used to achieve methods of the invention.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB BBC, AAABCCCC, CBBAAA, CABABB, and so forth. The skilled artisan will understand that typically there is no limit on the number of items or terms in any combination, unless otherwise apparent from the context.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

Superconducting cavities in particle accelerators work on the general principle that an electric field within the cavity provides acceleration to a particle beam. However, there is a corresponding magnetic field that can't be wholly avoided. The quality factor, which may be referred to herein as "$Q_0$," is a dimensionless parameter to describe the amount of resistance experienced in the cavity material. For purposes of a superconducting cavity, lower resistance (or a higher quality factor) is desirable, because it means that less power is dissipated in the cavity walls.

Formation of a superficial layer (also referred to as a "layer" or "dirty layer") can act as a perturbation on the magnetic induction profile in the superconducting material. Thus, the layer can serve to stabilize the superconductor against vortex nucleation, and shift the lower critical field of the whole structure up to the bulk's value, increasing the magnetic field range in which the Meissner state is stable. In the embodiments disclosed herein, creation of such a layer is described. The superficial layer can improve both the gradient and the Q-factor of the material and minimize the Mattis-Bardeen surface resistance. Various techniques, as disclosed herein, can be employed to both create and control the characteristics of the layer. Aspects of the embodiments may include such characteristics of the layer, as well as methods and systems used to form the layer.

Therefore, according to the methods and systems disclosed herein it is possible to achieve high Quality factors up to high gradients, resulting in high gradient materials that can be used for superconducting applications, including accelerator applications, and more specifically SRF cavity accelerator applications. One aspect can include forming a layer that can comprise a layer formed on a niobium substrate. In other aspects, the layer can comprise a layer formed on, or in, a superconducting accelerator cavity. In still other aspects, the layer can comprise a layer formed on or in an SRF cavity.

While there are many different known superconducting materials, it is desirable in accelerator applications to find a material with a large critical temperature ($T_c$) and a large metastable limit ($H_{sh}$). In addition, it is preferable to use a material that can be fabricated into large structures with complex geometries, that is easy to clean, and has a coherence length of at least ~1 nm. Niobium ($Nb_3Sn$) meets these criteria fairly well because it offers a relatively high Quality factor even at relatively high temperatures.

In certain embodiments, the characteristics of the superconducting material can be further improved according to the methods and systems disclosed herein. For example, in an embodiment, a vapor diffusion process can be used to coat the internal surfaces of a cavity. In the embodiments disclosed herein the workpiece will be described as a cavity, such as an SRF cavity associated with a particle accelerator. However, it should be appreciated that the workpiece can more generally comprise any cavity, workpiece, structure, or substrate. In certain embodiments, the cavity can comprise a niobium structure. In other cases, other superconducting materials could additionally, or alternatively, be used.

FIG. 1 illustrates a basic diagram of a system 100 for vapor diffusion of tin on to a niobium cavity, according to the embodiments disclosed herein. In general, a cavity 105 (which can more generally comprise any workpiece or substrate) can be held in a coating chamber 110. The coating chamber 110 can comprise a chamber in an ultra-high vacuum (UHV) furnace 115.

A separate heater 120, that is not the heating element associated with the UHV furnace, can be used to heat the vapor material 125 held in a crucible 130. In this exemplary embodiment, the vapor material 125 comprises tin, but in other embodiments other vapor materials could be used. The separate heater 120 is used to heat the vapor material 125. The separate heater 120 can thus heat the vapor material 125 to the point where it vaporizes.

Figure 2:
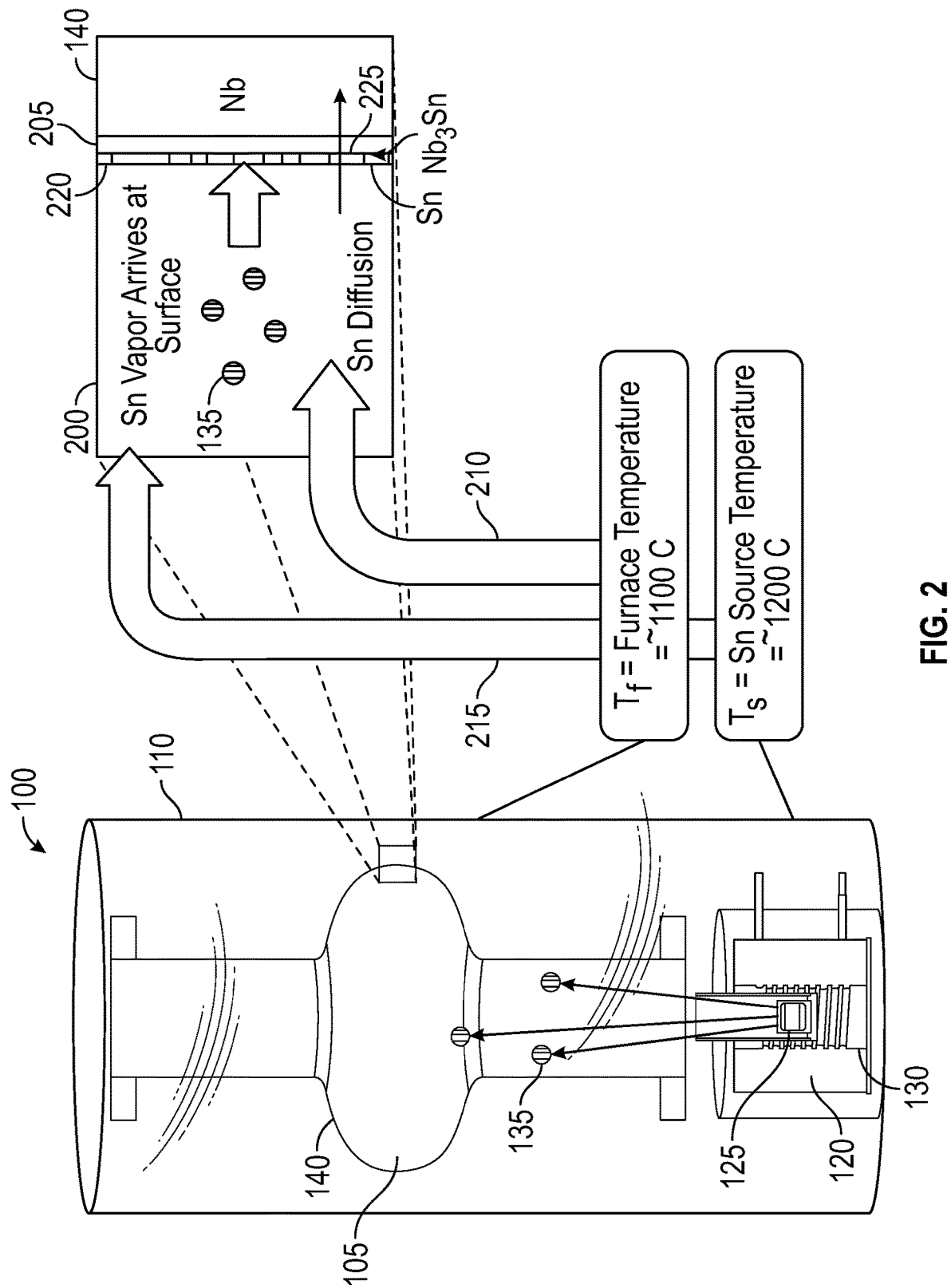
FIG. 2 depicts a system for treating a workpiece with an exploded view illustrating a resulting surface interaction, in accordance with the disclosed embodiments.

FIG. 2 illustrates a coating method via vapor diffusion using the basic system illustrated in FIG. 1. More detailed steps associated with a coating method are discussed with respect to FIGS. 5-11. Once the cavity 105 is properly in place in the chamber 110, the UHV furnace 115 can be used to keep the coating chamber 110 (and cavity 105) at approximately 1100 degrees C. as shown by arrow 210, while the separate heater 120 (or the auxiliary heater), heats the vapor material 125 to approximately 1200 degrees C. as shown by arrow 215. These values are nonlimiting and meant to be exemplary values used in this embodiment. As the separate heater 120 increases the temperature of the vapor material 125, the vapor material 125 will begin to vaporize.

The vapor 135 arrives at the inner surface 140 of the cavity 105, where diffusion takes place. Exploded view 200 illustrates the exemplary case illustrated in FIG. 2, where the tin vapor 135 arrives at the surface 140 of the Nb cavity 105. As the tin 220 reaches the inner surface 140 the diffusion process, illustrated as arrow 225, occurs creating a "layer" 205, which, in this exemplary embodiment, comprises $Nb_3Sn$.

Figure 3:
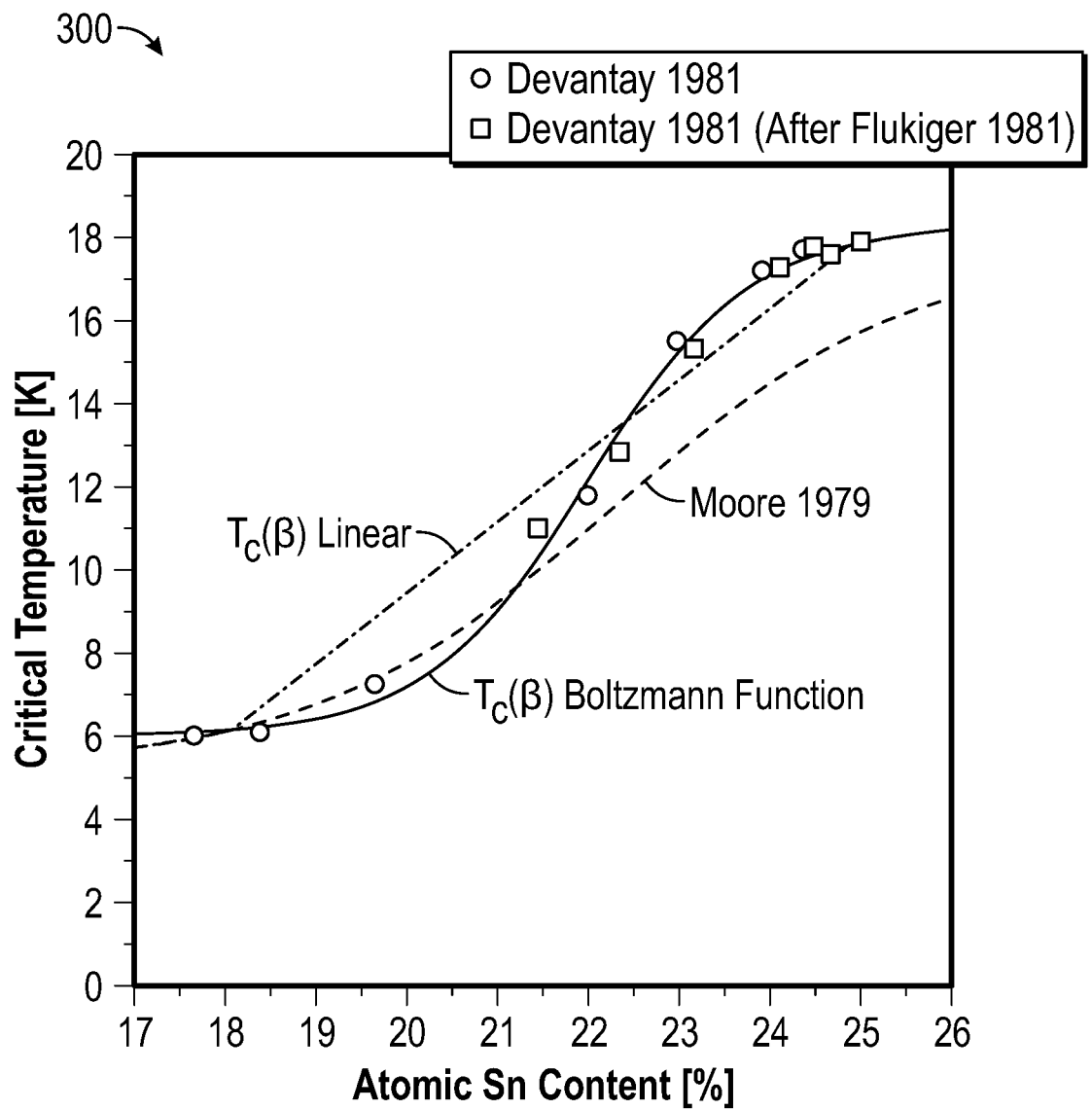
FIG. 3 depicts a chart of atomic tin content versus critical temperature which may be used, in accordance with the disclosed embodiments.

Control over the abundance of the tin vapor 135 can be exercised so that the diffusion rate is balanced to achieve the desired stoichiometry. FIG. 3 illustrates a chart 300 (originally appearing in "A review of the properties of $Nb_3Sn$ and their variation with A15 composition, morphology and strain state" by A. Godeke) of empirical observations of atomic tin content versus critical temperature. Controlling temperature can provide a means by which the tin vapor abundance can be controlled.

It should be appreciated that vapor diffusion as illustrated in FIG. 2, represents one means by which the cavity 105 can be treated. In other embodiments, programs to produce the desired coatings (e.g. $Nb_3Sn$ coatings) by methods other than vapor diffusion can be employed. For example, in some embodiments chemical vapor deposition, liquid tin dipping, multilayer sputtering, mechanical plating, electron beam coevaporation, bronze processing, and/or electrodeposition can be used to create the desired layer 205 of material. It should be noted that many of these process can be followed by an annealing step at high temperature.

Figure 4:
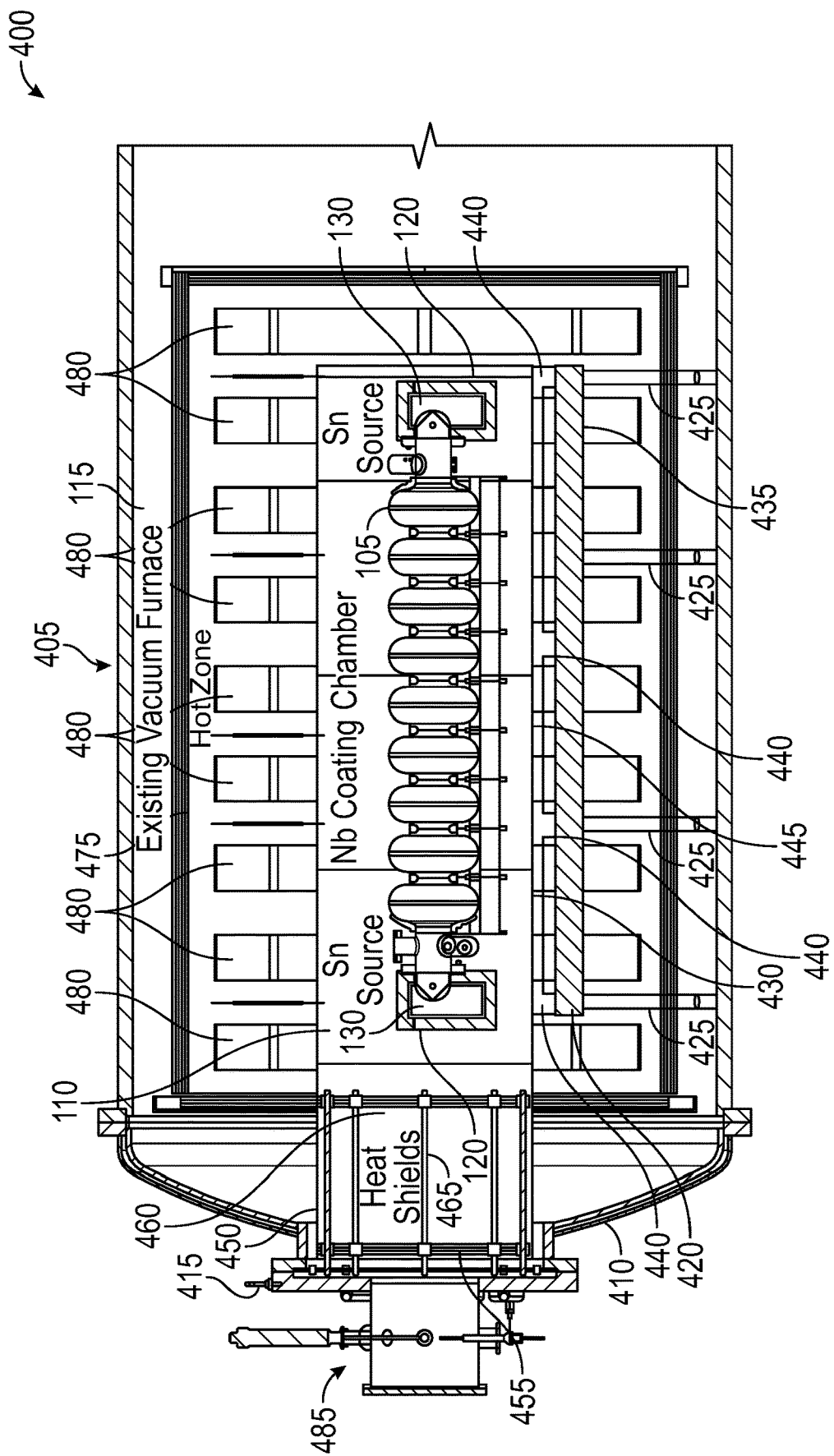
FIG. 4 depicts a system for treating an SRF cavity, in accordance with the disclosed embodiments.

FIG. 4, illustrates a more detailed diagram of a system 400 for treating a cavity and/or creating a composition of matter in accordance with the disclosed embodiments. Various aspects and/or elements of the system 400 are functional equivalents of aspects of the system 100 and like reference numerals are used to identify like elements.

The system 400 includes a housing 405. The housing 405 includes an access door 410 formed in an endplate 415. The access door 410 can be formed of stainless steel or other such material, and the endplate 415 formed can also be formed of stainless steel or other such material. A neck 450 can be formed in the access door 410 and connected to the end plate 415. The neck 450 can have an outer heat shield 455 connected to an inner heat shield 460 via at least one heat shield pin 465.

The housing 405 houses a furnace 115, in which a workpiece 105, such as a SRF cavity, can be inserted. The workpiece 105 can generally be formed of a super conductor such as Nb. A chamber support sled 430 can be configured on a chamber support base 420. The chamber support base 420 generally comprises a series of legs 425 connected to a horizontal rim structure 435. The chamber support sled 430 can be formed of lateral slats 440 connected to a rib 445. The lateral slats 440 can slide along the horizontal rim structure 435. The chamber support sled 430 can thus be used to support the coating chamber 110.

The workpiece 105 is held in the coating chamber 110. In many cases, the workpiece may have an unusual shape. For example, in the case where the workpiece comprises an SRF cavity as illustrated in FIG. 4, the SRF cavity will comprise a series of curved cells connected to one another. The shape can be somewhat untenable. A specially configured cavity holder 470 can be formed inside the coating chamber 110. The cavity holder 470 can be configured to hold the workpiece 105.

The workpiece 105 can thus be inserted into the coating chamber 110 inside the furnace 115. The hot zone 475 of the furnace 115 can include a series of one or more heating elements 480, that encircle the coating chamber 110. As previously noted, the coating process can be performed at high vacuum in a high vacuum furnace. As such, the end of the furnace can include a vacuum fitting 485 configured to interface with a vacuum pulling assembly (not shown) to produce the vacuum therein.

The crucible 130 can comprise a tungsten crucible, and a crucible 130 can be situated at either end, or both ends, of the cavity 105. Each crucible 130 can be filled with vapor material 125. In certain embodiments, the vapor material 125 can comprise pellets, such as tin pellets, that can be in a Niobium can inside the clean/vacuum-compatible heater(s) 120. In certain embodiments additional material (e.g. tin) sources can be used for coating, depending on the geometry of the inner surfaces of the cavity. A Niobium retort comprising a cylinder open on only one side, can be used to protect the molybdenum hot zone 480 of the furnace 115 from the material (tin) vapor.

In certain embodiments, valving (not shown), can include cryopump valving and rough pump valving, that can be included in the system. The rough pump valving provides a means for injecting nitrogen gas into the chamber. The nitrogen gas can be held in the chamber at pressure to allow nitrogen doping of the surfaces.

The location of the tin and/or chamber can be adjusted to ensure full uniformity in coating the chamber. The amount of tin can also be adjusted according to the application. Too much tin may result in spotting on the surface of the cavity. Thus, the amount of tin should be carefully selected to provide proper coating of the chamber without inducing spotting.

Figure 5:
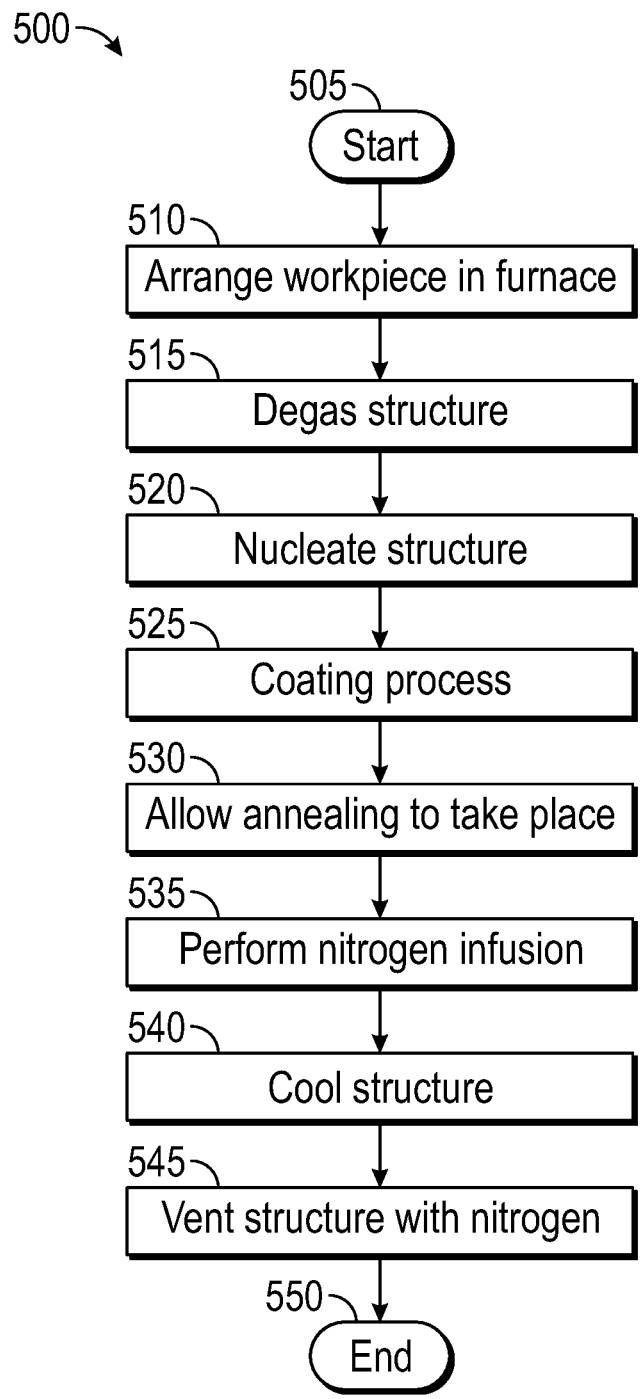
FIG. 5 depicts steps associated with a method for treating a workpiece, in accordance with the disclosed embodiments.

FIG. 5 illustrates a flow chart of steps associated with a method for creating a composition of matter, such as for example, a nitrogen doped $Nb_3Sn$ structure using the system illustrated in FIGS. 1 and 4. It should be understood that the method 500 and associated sub steps are generally illustrated as flow charts. The order of the steps in these flow charts is meant to be exemplary. In certain embodiments, one or more of the steps illustrated can be performed in a different order, or steps may be performed concurrently without departing from the scope of the disclosure. The method begins at 505.

The method 500 begins by arranging a workpiece or structure (e.g. an SRF cavity) in a system such as the system illustrated in FIG. 4, as shown at step 510. In general, the workpiece can be inserted into the coating chamber and held with a cavity holder. The coating chamber can be slid into place in the furnace on the chamber support sled.

Next, at step 515, a degassing operation is performed. In this step, the chamber with the workpiece therein is degassed. This can be done with a vacuum pulling apparatus integral to the housing, or with an external vacuum pulling device.

Figure 6:
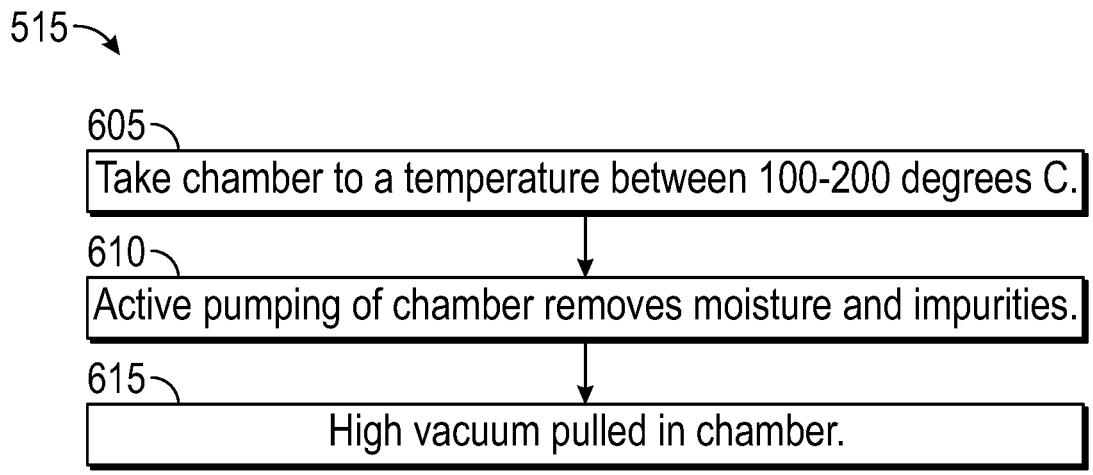
FIG. 6 depicts steps associated with a method for degassing a structure, in accordance with the disclosed embodiments

FIG. 6 illustrates sub steps associated with step 515. In certain embodiments, degassing can take place at relatively low temperatures (e.g. temperatures below 200 degrees C.). In an exemplary embodiment, the chamber with the structure therein is taken to a temperature between 100 degrees C. and 200 degrees C. as shown at step 605. During this time, as shown at 610, active pumping on the chamber removes residual moisture and other impurities that may have been introduced during the opening of the furnace and the placing of the structure in the furnace. At step 615, a high vacuum can be pulled in the chamber in preparation for additional steps.

Next, at step 520, the structure can be nucleated. Nucleation is generally understood to define the self-assembly required for the formation of a new structure upon introduction of a secondary material.

Figure 7:
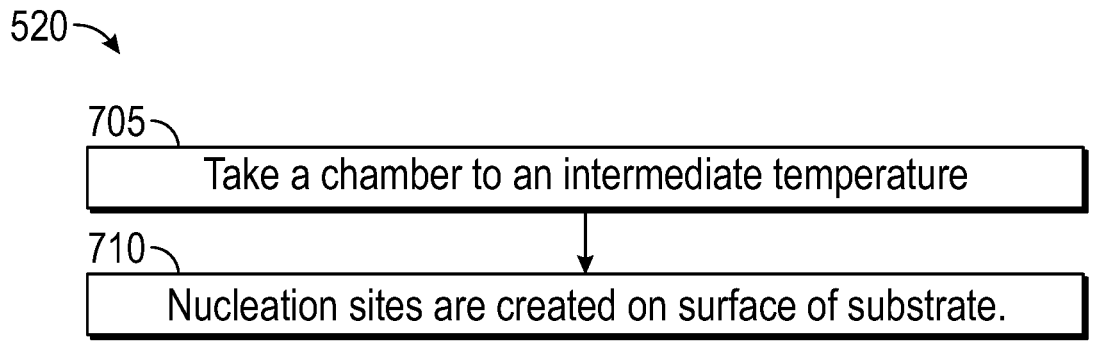
FIG. 7 depicts steps associated with a method for nucleating a structure, in accordance with the disclosed embodiments.

FIG. 7 illustrates steps associated with nucleation, in accordance with the embodiments disclosed herein. Nucleation can be achieved by taking the chamber to an intermediate temperature as shown at 705, during which time nucleation sites are created on the surface of the substrate (e.g. the surface of the niobium or other such superconductor) as shown at 710. In certain embodiments the temperature can preferably be held at approximately 500 degrees C., but in other embodiments the temperature can be held at any temperature between 300 degrees C. and 700 degrees C. In some embodiments, this can be done either by pre-anodization and the introduction of a temperature gradient during the ramp-up, or with the use of a nucleation agent such as $SnF_2$ or $SnCl_2$. Using a nucleation agent instead of pre-anodization helps to prevent uncovered areas, but avoids the residual resistance ratio (RRR) degradation that may result after growing a thick oxide and then diffusing it into the bulk of the niobium substrate.

Figure 8:
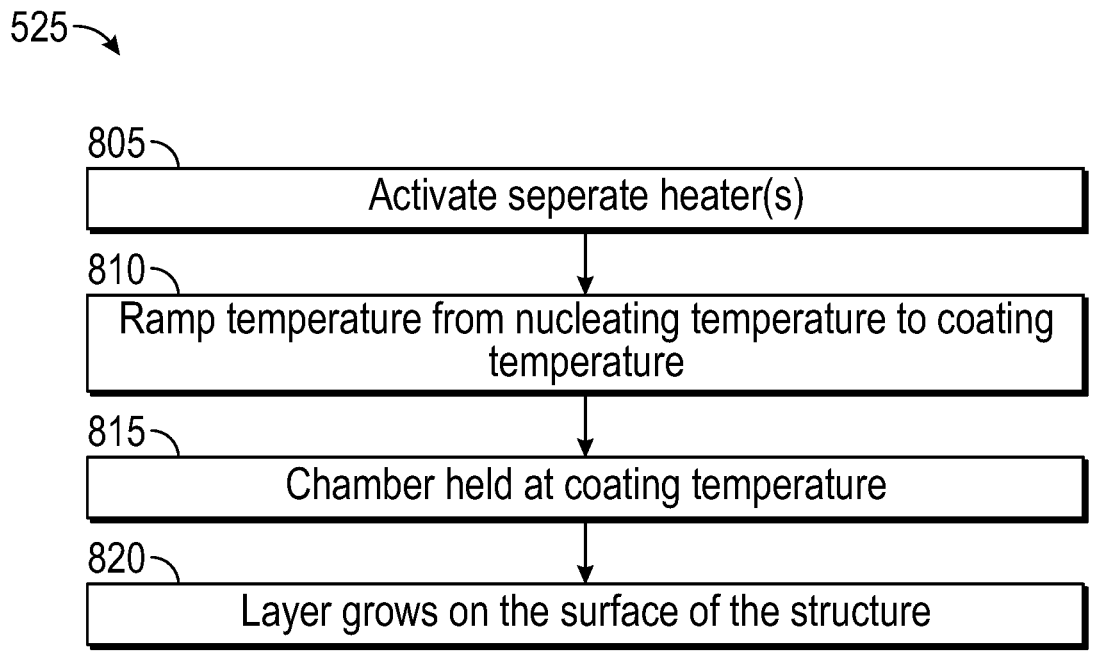
FIG. 8 depicts steps associated with a method for coating a structure, in accordance with the disclosed embodiments.

Next at step 525, the coating process can be completed. It should be appreciated that numerous coating methods for coating the structure can be employed. FIG. 8 illustrates steps associate with an exemplary coating process. The coating process 525 can begin at 805 by activating the separate heater associated with the vapor material. The separate heater can be used to ramp to the coating temperature from the temperature at which nucleation was performed (e.g. 500 degrees C.) to a coating temperature, as shown at 810.

After the temperature has been ramped to the coating temperature, the material can be held at the coating temperature as shown at 815. In exemplary embodiments, the coating temperature can be a constant temperature above 950 degrees C. This is a threshold temperature at which the low-Tc phases of Nb—Sn ($Nb_6Sn_5$ and $NbSn_2$) are thermodynamically unfavorable. During this phase, a layer grows on the surface of the niobium, as tin consumed in the production of the layer, is replenished by the tin source, as illustrated at 820. During the coating step 525, it is critical that the temperature of the tin gas be sufficiently high to ensure a uniform coating of the structure.

It should be noted that the temperature of the tin source can outpace that of the structure. For example, in an embodiment, the coating step can include increasing the temperature of the structure in the chamber to approximately 1100 degrees C. and increasing the temperature of the tin source, via the tin source heater, to approximately 1200 degrees C. and maintaining them at that temperature for several hours (e.g. 1-5 hours). In a more general case, the chamber can be held between 930 degrees C. and 1400 degrees C. The separate heater for the tin source is not strictly necessary but can be advantageous in certain cases. The tin source can, in various embodiments, be between 0 degrees C. warmer than the cavity and approximately 400 degrees C. warmer than the cavity during the coating process.

In other embodiments, other methods for coating can be used. Such alternative coating methods can include chemical vapor deposition, liquid tin dipping, multilayer sputtering, mechanical plating, electron beam coevaporation, bronze processing, and electrodeposition. At the conclusion of this step the structure is coated by any one of the methods described above.

Figure 9:
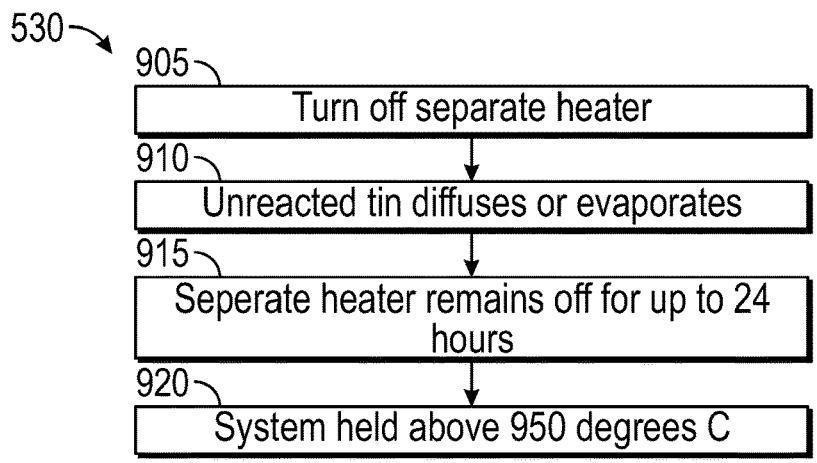
FIG. 9 depicts steps associated with an annealing process, in accordance with the disclosed embodiments.

Returning to the method 500 shown in FIG. 5, at step 530 an annealing process can be performed. In this step, as illustrated in FIG. 9, the separate heater can be turned off at 905 to allow all the unreacted tin on the surface of the structure to diffuse or evaporate at step 910. The annealing process can generally go on for 0-5 hours. In certain embodiments, annealing can go on for any amount of time less than 24 hours as shown at step 915. The annealing step serves to reduce the rate of tin arriving at the surface of the part. During this time, the chamber is held at a temperature above 950 degrees C. as shown at 920, in some cases, this is the same temperature at which it was held during the coating stage. The purpose of this step is to allow any excess of pure tin at the surface of the part to diffuse into the layer and form $Nb_3Sn$.

Figure 10:
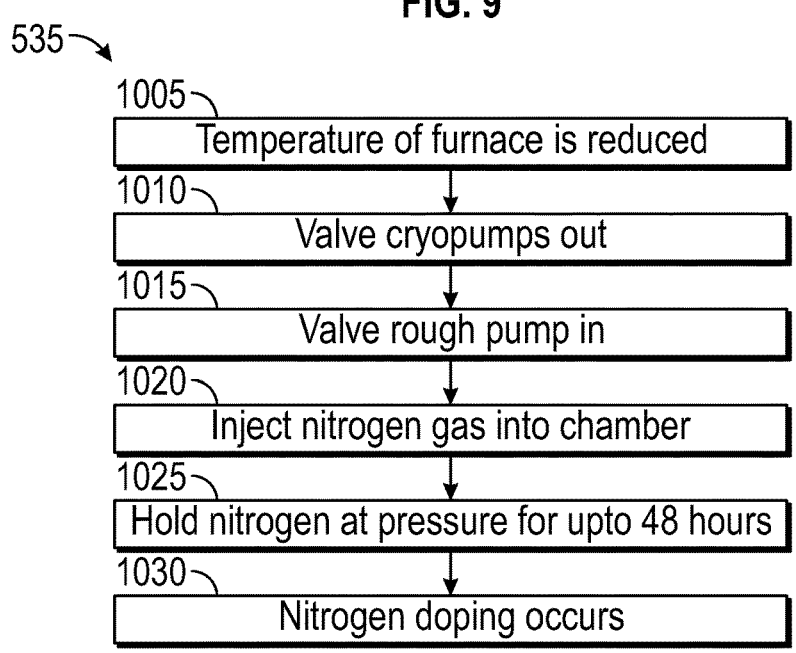
FIG. 10 depicts steps associated with a method for nitrogen infusion, in accordance with the disclosed embodiments.

In certain embodiments, after the annealing step, an infusion step 535 can optionally be performed. FIG. 10 illustrates processes associated with the infusion step 535. During the infusion step, the temperature of the furnace heating the structure can be reduced from the temperature used during coating (e.g. 1100 degrees C.) to a temperature not less than 50 degrees C. and not more than 300 degrees C., and preferably approximately 120 degrees C. as illustrated at 1005. Cryopumps can be valved out as shown at 1010 and a rough pump can be valved in as shown at 1015 so that high purity nitrogen gas can be injected into the structure as shown at 1020.

The nitrogen gas can be held at a pressure ranging from approximately 1 mTorr to approximately 1 Torr. At pressures lower than 1 mTorr a shortened mean free path may result in poor diffusion. At pressures above 1 Torr the supporting furnace structure may suffer structural damage. As such, in certain embodiments, approximately 25 mTorr (or other required pressure) for up to 48 hours can be used as illustrated at 1025. During this time, nitrogen doping occurs in the structure, as shown at step 1030.

After the nitrogen doping, all the heating equipment (i.e. the UHV furnace and/or the separate heater(s) is turned off and the structure is allowed to cool as illustrated at 540. This may take place over a number of hours. After the structure is cool, at step 545, the structure can be vented with nitrogen gas at room temperature, at which point the method ends at 550.

The 120 degree C. "nitrogen infusion" process may create a dense concentration of nitrogen impurities close to the inner surface of the workpiece. In certain embodiments, the dense concentration may be correlated with a significant increase in maximum gradient. This enhancement may result from an increase in the height of the "Bean-Livingston" barrier, which describes the energy required for vortex penetration to occur in a superconductor.

Figure 11:
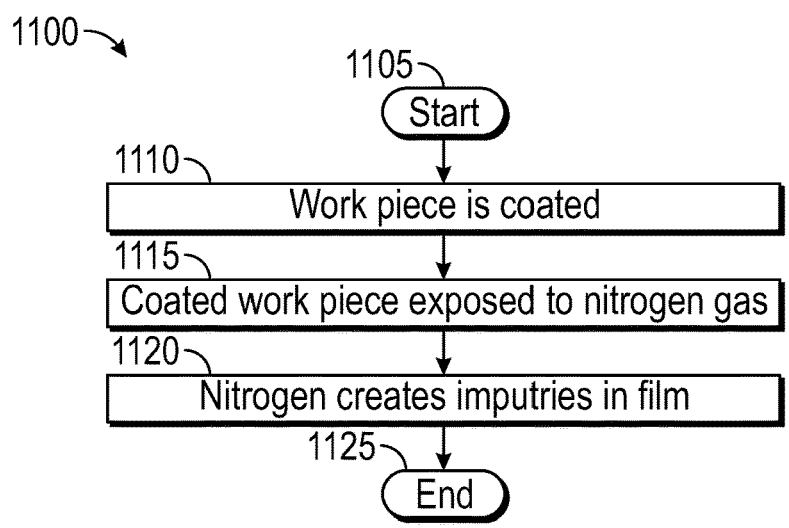
FIG. 11 depicts steps associated with a method for treating a workpiece, in accordance with the disclosed embodiments.

FIG. 11 illustrates a flow chart associated with a vapor diffusion method 1100 for creating a composition of matter. The method begins at 1105. In the embodiments disclosed herein, an $Nb_3Sn$ film can be created by the vapor diffusion process or other such process. Following an initial coating step at 1110, the film is exposed to nitrogen gas at an intermediate temperature for a set duration (e.g. 25 mTorr at 120 C for 48 hours, but these values could differ) as illustrated at step 1115. The nitrogen gas exposure generates nitrogen impurities in the film as shown at 1120, resulting in a new composition of matter comprising nitrogen doped $Nb_3Sn$. In certain embodiments, the structure can be exposed to nitrogen prior to exposure of the film to atmospheric gases. It should be appreciated that, in other embodiments, it is possible to perform the coating, expose the cavity to atmospheric gases, and then to bring the cavity back into a vacuum furnace, heat it up to high temperatures to dissolve the oxide, and then expose it to nitrogen in the nitrogen infusion step. The method ends at 1125.

In additional aspects of the disclosed embodiments, improvements to the Quality factor of the workpiece can be achieved by other processes. For example, in an embodiment, another means of improving the Quality factor of the workpiece (or cavity) can be achieved by making the layer or surface film thinner. The thinner layer of $Nb_3Sn$ has proportionally lower surface roughness, which may result in an improved Quality factor associated with the workpiece.

Creating a thinner layer can be achieved in multiple ways. In a first aspect, less tin can be provided in the crucibles. In another aspect, a sink for the excess tin vapor can be used. In certain embodiments the coating chamber can be formed of niobium. In such cases, the niobium coating chamber itself can serve as a tin sink for excess tin vapor. The use of such a sink results in a thinner film deposited on the workpiece since some of the tin vapor is deposited on the sink. In other embodiments, additional sink elements can also be inserted in the chamber, so that the sink elements are coated by some or all of the excess tin vapor.

An aspect of the disclosed embodiments is controlling evaporation rates of the tin by controlling the amount of tin, surface area of tin in the crucible (i.e. selecting crucible size), and/or by including a sink. Additionally, failure to maintain sufficient vapor pressure, may result in patchy regions with relatively thin coatings.

Controlling the evaporative rate can be explained by way of example. Thus, in one embodiment, an exemplary 9-cell 1.3 GHz niobium cavity with interior surface area of 0.96 square meters, can be coated with 5 grams of tin which can be evaporated over 3 hours. The resulting $Nb_3Sn$ layer will be approximately 1 micrometer thick, with a density of approximately 9 g/cubic cm. This gives 8.64 g of $Nb_3Sn$. $Nb_3Sn$ by weight is 30% tin, so this gives 2.6 g of tin in the actual coating. In other words, in this coating process, only approximately 50% of the evaporated tin is incorporated into the coating.

In another example, to coat a 1-cell 1.3 GHz niobium cavity with interior surface area of 0.1625 square meters, 2.5 g of tin can be evaporated over 3 hours. The $Nb_3Sn$ layer will be approximately 1 micrometer thick. So only 0.44 g of tin is incorporated into the coating. This is less than ⅕th of the tin that evaporated. The rest was not added to the cavity interior surface and is instead absorbed by a sink which can comprise the coating chamber.

In yet another example, to coat a 650 MHz 1-cell cavity with interior surface area of 0.48 square meters, 4.0 g of tin can be evaporated. Again, the coating will be 1 micrometer thick, which gives 1.3 g of tin remaining on the interior surface. Again, a place for the other 2.7 g of tin to go is required. Thus, in such embodiments, controlling the evaporation rate can be achieved by controlling the amount of tin, the surface area of the tin in the crucible, and by incorporating a sink to collect excess tin vapor.

Based on the foregoing, it can be appreciated that a number of embodiments, preferred and alternative, are disclosed herein. For example, in an embodiment, a method comprises arranging a niobium structure in a coating chamber, coating the niobium structure with tin, and forming an $Nb_3Sn$ layer on the niobium structure.

In an $Nb_3Sn$, the method comprises doping the $Nb_3Sn$ layer with nitrogen, wherein doping the $Nb_3Sn$ layer with nitrogen further comprises pressurizing a volume holding the $Nb_3Sn$ layer with nitrogen gas and leaving the $Nb_3Sn$ layer in the nitrogen gas for at least 1 hour. In an embodiment, the pressure of the volume holding the $Nb_3Sn$ layer with the nitrogen gas is at least 1 mTorr and at most 1 Torr. In an embodiment, the method comprises cooling the niobium structure after leaving the $Nb_3Sn$ layer in the nitrogen gas for at least 1 hour. In an embodiment, the method comprises venting the volume holding the $Nb_3Sn$ layer after cooling the niobium structure.

In an embodiment, the method comprises degassing the coating chamber before coating the niobium structure with tin. In an embodiment, the method comprises nucleating the niobium structure after the coating chamber is degassed. In an embodiment, the method comprises annealing the niobium structure such that unreacted tin on a surface of the niobium structure evaporates. In an embodiment, the method comprises the niobium structure comprises a superconducting radiofrequency cavity.

In another embodiment, a system for treating a workpiece comprises a furnace, a coating chamber configured inside the furnace, the coating chamber configured to house a workpiece, a vapor material provided in the coating chamber, and a separate heater for heating the vapor material.

In an embodiment, the system comprises a housing configured to house the furnace. In an embodiment, the system comprises an endplate formed in the housing and an access door formed in the endplate. In an embodiment, the system comprises at least one heat shield formed between the endplate and the furnace.

In an embodiment, the system comprises a chamber support base for holding the coating chamber in the furnace. In an embodiment, the system comprises a chamber support sled affixed to the coating chamber, the chamber support sled being configured to engage with the chamber support base.

In an embodiment, the system comprises a crucible for holding the vapor material, the crucible being proximate to the separate heater. In an embodiment, the vapor material comprises tin.

In an embodiment, the workpiece comprises a niobium substrate. In an embodiment, the system comprises a cavity holder for holding the workpiece inside the coating chamber.

And in yet another embodiment, a composition of matter comprises a nitrogen doped $Nb_3Sn$ layer formed on a surface of a niobium substrate.

It will be appreciated that variations of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art which are also intended to be encompassed by the following claims.

What is claimed is:

1. A method comprising:
arranging a niobium structure in a coating chamber;
coating the niobium structure with tin;
forming an $Nb_3Sn$ layer on the niobium structure;
doping the $Nb_3Sn$ layer with nitrogen, wherein doping the $Nb_3Sn$ layer with nitrogen further comprises:
pressurizing a volume holding the $Nb_3Sn$ layer with nitrogen gas; and
leaving the $Nb_3Sn$ layer in the nitrogen gas for at least 1 hour.

2. The method of claim 1 wherein a pressure of the volume holding the $Nb_3Sn$ layer with the nitrogen gas is at least 1 mTorr and at most 1 Torr.

3. The method of claim 1 further comprising:
cooling the niobium structure after leaving the $Nb_3Sn$ layer in the nitrogen gas for at least 1 hour.

4. The method of claim 3 further comprising:
venting the volume holding the $Nb_3Sn$ layer after cooling the niobium structure.

5. The method of claim 1 further comprising:
degassing the coating chamber before coating the niobium structure with tin.

6. The method of claim 5 further comprising:
nucleating the niobium structure after the coating chamber is degassed.

7. The method of claim 1 further comprising:
annealing the niobium structure such that unreacted tin on a surface of the niobium structure evaporates.

8. The method of claim 1 wherein the niobium structure comprises a superconducting radiofrequency cavity.

* * * * *